United States Patent
Morris et al.

(10) Patent No.: US 10,573,385 B2
(45) Date of Patent: Feb. 25, 2020

(54) FERROELECTRIC BASED MEMORY CELL WITH NON-VOLATILE RETENTION

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/567,942

(22) PCT Filed: May 28, 2015

(86) PCT No.: PCT/US2015/032943
§ 371 (c)(1),
(2) Date: Oct. 19, 2017

(87) PCT Pub. No.: WO2016/190880
PCT Pub. Date: Dec. 1, 2016

(65) Prior Publication Data
US 2018/0122478 A1    May 3, 2018

(51) Int. Cl.
*G11C 5/02* (2006.01)
*G11C 14/00* (2006.01)
(Continued)

(52) U.S. Cl.
CPC ........ *G11C 14/0072* (2013.01); *G11C 11/221* (2013.01); *G11C 11/2259* (2013.01);
(Continued)

(58) Field of Classification Search
CPC .............. G11C 14/0072; G11C 11/221; G11C 11/2259; G11C 11/2273; G11C 11/2275; G11C 14/0027; H01L 27/11502
(Continued)

(56) References Cited

U.S. PATENT DOCUMENTS

| | | | |
|---|---|---|---|
| 5,559,733 A | | 9/1996 | McMillan et al. |
| 5,737,261 A | * | 4/1998 | Taira .................. G11C 11/22 257/295 |

(Continued)

FOREIGN PATENT DOCUMENTS

TW        201508483        3/2015

OTHER PUBLICATIONS

International Preliminary Report on Patentability from PCT/US2015/032943 dated Dec. 7, 2017, 7 pgs.
(Continued)

*Primary Examiner* — Huan Hoang
(74) *Attorney, Agent, or Firm* — Green, Howard & Mughal LLP

(57) ABSTRACT

Described is an apparatus which comprises: a first access transistor controllable by a write word-line (WWL); a second access transistor controllable by a read word-line (RWL); and a ferroelectric cell coupled to the first and second access transistors, wherein the ferroelectric cell is programmable via the WWL and readable via the RWL. Described is a method which comprises: driving a WWL, coupled to a gate terminal of a first access transistor, to cause the first access transistor to turn on; and driving a WBL coupled to a source/drain terminal of the first access transistor, the driven WBL to charge or discharge a storage node coupled to the first access transistor when the first access transistor is turned on, wherein the ferroelectric cell is coupled to the storage node and programmable according to the charged or discharged storage node.

21 Claims, 8 Drawing Sheets

(51) Int. Cl.
*G11C 11/22* (2006.01)
*H01L 27/11502* (2017.01)

(52) U.S. Cl.
CPC ...... *G11C 11/2273* (2013.01); *G11C 11/2275* (2013.01); *G11C 14/0027* (2013.01); *H01L 27/11502* (2013.01)

(58) Field of Classification Search
USPC .......................................................... 365/51
See application file for complete search history.

(56) References Cited

U.S. PATENT DOCUMENTS

| | | | |
|---|---|---|---|
| 6,198,652 B1 | 3/2001 | Kawakubo et al. | |
| 6,724,645 B1 | 4/2004 | Lanham et al. | |
| 9,129,674 B2 | 9/2015 | Ramanujan | |
| 2003/0235067 A1* | 12/2003 | Sakai | G11C 11/22 365/145 |
| 2004/0225829 A1 | 11/2004 | Akiyama et al. | |
| 2004/0268075 A1* | 12/2004 | Qawami | G06F 13/4243 711/167 |
| 2006/0083098 A1* | 4/2006 | Ho | G11C 7/1006 365/230.05 |
| 2011/0095272 A1 | 4/2011 | Ng et al. | |
| 2011/0147807 A1 | 6/2011 | Wilson et al. | |
| 2012/0134196 A1 | 5/2012 | Evans et al. | |
| 2014/0211532 A1 | 7/2014 | Bartling et al. | |
| 2014/0325249 A1 | 10/2014 | Toyotaka | |

OTHER PUBLICATIONS

Aoki, Masaki et al., "Novel Gain Cell with Ferroelectric Coplanar Capacitor for High-Density Nonvolatile Random-Access Memory", Int.ElecronDevicesMeet.IDMTech.Dig., pp. 68-69, 1997.
Fitsilis, Michael, "Scaling of the Ferroelectric Field Effect Transistor and Programming Concepts for Non-volatile Memory Application", A dissertation approved by the faculty of electrical engineering and information technology submitted on Feb. 2, 2005, 134 pgs.
Miwa, Tohru et al., "NV-SRAM: A Nonvolatile SRAM with Backup Ferroelectric Capacitors", IEEE Journal of Solid-State Circuits, vol. 36, No. 3, pp. 522-527, Mar. 2001.
Sheikholeslami, Ali et al., "A Survey of Circuit Innovations in Ferroelectric Random-Access Memories", Proc.IEEE, vol. 88, No. 5, pp. 667-689, 2000.
International Search Report and Written Opinion for International Patent Application No. PCT/US15/32943, dated Mar. 31, 2016.
Extended European Search Report from European Patent Application No. 15893518.9 dated Dec. 7, 2018, 9 pgs.
Office Action from Taiwan Patent Application No. 105112452 dated Jul. 5, 2019, 8 pgs.
Office Action from European Patent Application No. 15893518.9, notified Dec. 13, 2019, 6 pgs.

* cited by examiner

US 10,573,385 B2

FERROELECTRIC BASED MEMORY CELL WITH NON-VOLATILE RETENTION

CLAIM OF PRIORITY

This Application is a National Stage Entry of, and claims priority to, PCT Application No. PCT/US15/32943, filed on 28 May 2015 and titled "FERROELECTRIC BASED MEMORY CELL WITH NON-VOLATILE RETENTION," which is incorporated by reference in its entirety for all purposes.

BACKGROUND

Dense low power embedded memory is used for computer products. Non-volatile operation by embedded memory is a desirable attribute to reduce standby power. However, known memories do not provide non-volatility, low power, and high switching speeds in one type of memory. For example, Static Random Access Memory (SRAM) is a high speed volatile memory but it consumes leakage power from an always-on power supply. Embedded Dynamic Random Access Memory (E-DRAM) is another high speed volatile memory that consumes dynamic power from refresh operations.

Lower standby power is exhibited by some non-volatile memories. For example, embedded Flash (eFlash), Magnetic Random Access Memory (MRAM), and Resistive Random Access Memory (RRAM) are non-volatile memories that exhibit low standby power but are unlikely to reach the performance level (i.e., SRAM comparable fast read and write operations at low power) required for many applications. Further, endurance of current non-volatile memories is low and write energy too high.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
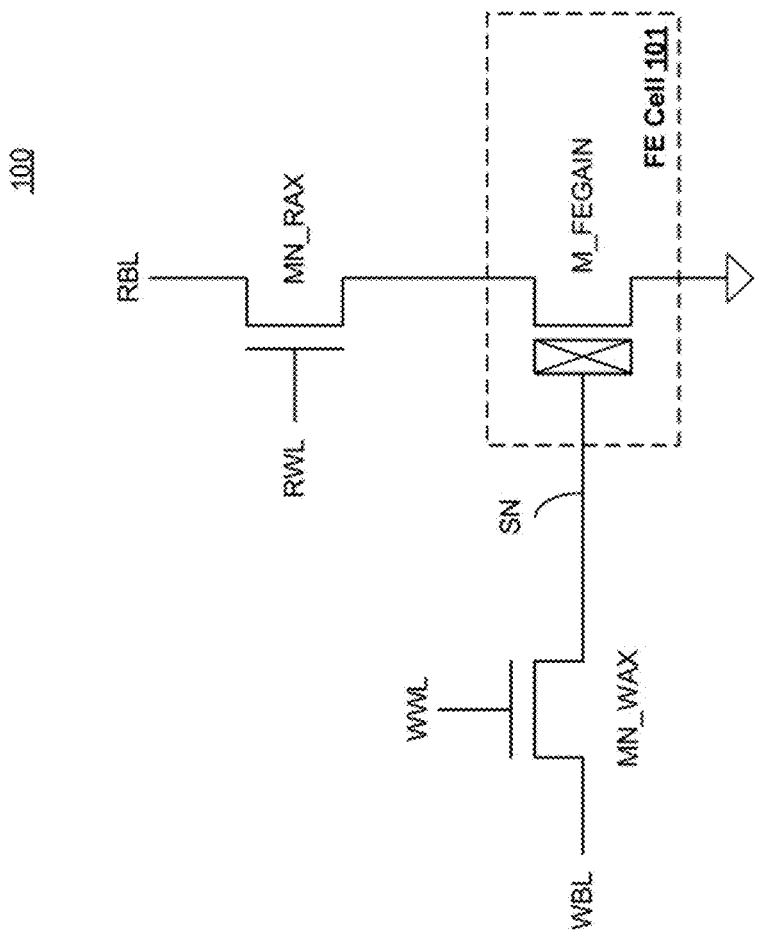
FIG. 1 illustrates an n-type three transistor ferroelectric static random access memory (3T-FE SRAM) bit-cell, according to some embodiments of the disclosure.

Some embodiments describe a memory cell that has Static Random "Access Memory (SRAM) like" fast read and write speeds, but with non-volatility. In some embodiments, the SRAM like bit-cell is a three transistor ferroelectric (3T-FE) SRAM bit-cell. In some embodiments, the 3T-FE SRAM bit-cell is a hybrid 3T-eDRAM (embedded dynamic random access memory) gain cell and non-volatile ferroelectric memory cell.

There are many technical effects of the 3T-FE SRAM bit-cell. For example, compared to a 3T-eDRAM bit-cell, the 3T-FE SRAM bit-cell of some embodiments does not require tight leakage tolerances because retention time is set by the relaxation of the ferroelectric polarization and not by subthreshold or gate leakage. As such, significantly less frequent refresh operations or no refresh operations are performed for the 3T-FE SRAM which lowers the dynamic refresh power consumption of the 3T-FE SRAM compared to the 3T-eDRAM. In some embodiments, the background programming of the ferroelectric polarization, together with the initial dynamic state storage, enables the 3T-FE SRAM to have the throughput and latency (including zero read-after-write latency) desired for many SRAM applications. Here, read-after-write refers to performing read operation immediately after the write operation completes.

The 3T-FE SRAM bit-cell allows for fast read and write operations. For example, the 3T-FE SRAM bit-cell has read and write operations faster than the simplest of the DRAM bit-cells (i.e., one transistor and one capacitor (1T-1C) DRAM bit-cell) due to low cell capacitance during write operation and a read operation which is not limited by bit-cell to bit-line charge-sharing. Other technical effects will be evident from various embodiments described here.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or magnetic connection between the things that are connected, without any intermediary devices. The term "coupled" means either a direct electrical or magnetic connection between the things that are connected or an indirect connection through one or more passive or active intermediary devices. The term "circuit" means one or more passive and/or active components that are arranged to cooperate with one another to provide a desired function. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic or ferroelectric FET devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates an n-type 3T-FE SRAM bit-cell 100, according so some embodiments of the disclosure. In some embodiments, 3T-FE SRAM bit-cell 100 comprises a first n-type access transistor MN_WAX (also referred to as the write access transistor); a second n-type access transistor MN_RAX (also referred to as the read access transistor); and ferroelectric cell (FE Cell) 101. In some embodiments, the first n-type access transistor MN_WAX is controllable by a write word-line (WWL). In some embodiments, the second n-type access transistor is controllable by a read word-line (RWL). In some embodiments, FE Cell 101 is coupled to the first and second access transistors, such that FE Cell 101 is programmable via the WWL and readable via the RWL.

In some embodiments, the gate terminal of transistor MN_WAX is coupled to WWL, the source/drain terminal of transistor MN_WAX is coupled to write bit-line (WBL), and the drain/source terminal of transistor MN_WAX is coupled to FE Cell 101 via storage node SN. In some embodiments, the gate terminal of transistor MN_RAX is coupled to RWL, the source/drain terminal of transistor MN_RAX is coupled to a read bit-line (RBL), and the drain/source terminal of transistor MN_RAX is coupled to FE Cell 101.

In some embodiments, FE Cell 101 includes an n-type transistor M_FEGAIN (i.e., ferroelectric gain transistor) having a gate terminal coupled to a ferroelectric capacitor (Fe-cap) illustrated as a rectangle with a cross. The ferroelectric capacitor is also referred to as the ferroelectric material or ferroelectric element. Any known suitable ferroelectric material can be used for forming the ferroelectric capacitor. In some embodiments, the ferroelectric capacitor is programmable via the WWL. In some embodiments, the ferroelectric capacitor is integrated within the gate terminal of transistor M_FEGAIN of FE Cell 101 (also referred to as the ferroelectric gain cell).

For example, the gate terminal of transistor M_FEGAIN of FE Cell 101 is a ferroelectric gate stack providing a function of a ferroelectric capacitor. In some embodiments, the ferroelectric capacitor is coupled in series between the gate terminal of the transistor M_FEGAIN of FE Cell 101 and the first access transistor MN_WAX shown with reference to FIG. 4. In some embodiments, the ferroelectric capacitor is coupled to one terminal of the ferroelectric cell, the first access transistor, and a node for providing a Read Assist signal as shown with reference to FIG. 5.

Referring back to FIG. 1, similar to a 3T eDRAM bit-cell, 3T-FE SRAM bit-cell 100 is read by sensing the current through a read transistor MN_RAX (also referred to as the second access transistor). In some embodiments, unlike an eDRAM bit-cell, logic state is stored in 3T-FE SRAM bit-cell 100 as a polarization of a ferroelectric gate stack, allowing for longer retention times (compared to eDRAM) which are insensitive to subthreshold leakage. In some embodiments, the repolarization of the ferroelectric material of 3T-FE SRAM bit-cell 100 can occur by the dynamic voltage or charge on the storage node SN after the RBL and WWL are de-asserted. As such, SRAM-like array speeds are realized unconstrained by the 10 ns to 100 ns ferroelectric switching times, for example. In some embodiments, all transistors of 3T-FE SRAM bit-cell 100 are ferroelectric transistors. For example, transistor MN_RAX and MN_WAX are implemented as ferroelectric transistors.

In some embodiments, the ferroelectric capacitor can be programmed by itself, long after write operation is finished, due to stored charge in the node. As such, the intrinsic long write time is hidden form the memory array operation. In some embodiments, the ferroelectric cell switches after 3T-FE SRAM bit-cell 100 is deselected by array signals allowing the intrinsic write time to be hidden from the memory array operation.

Figure 2A:
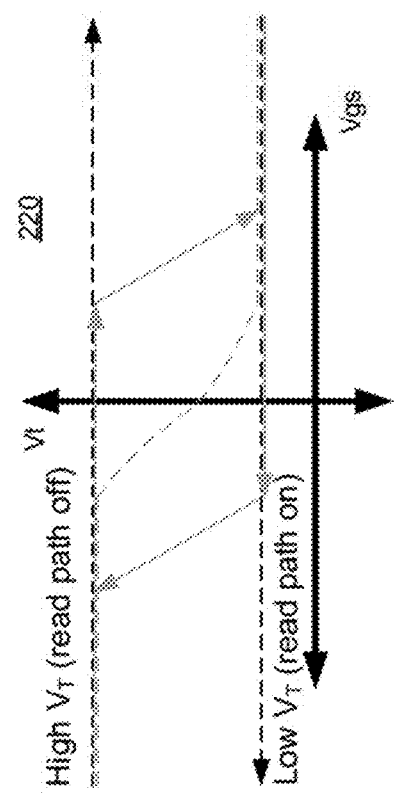
FIGS. 2A-C illustrate plots showing the memory principle of ferroelectric (FE) transistor, according to some embodiments of the disclosure.
Figure 2B:
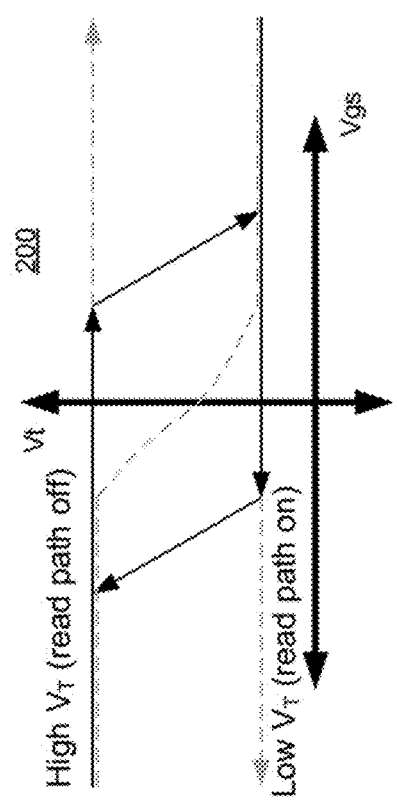
Figure 2C:
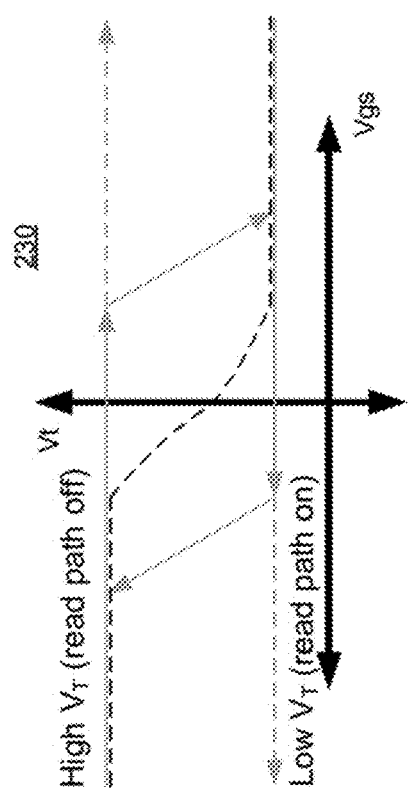
Figure 2D:
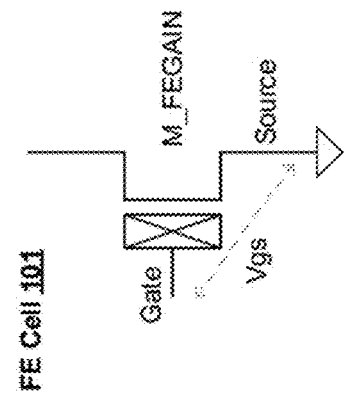
FIG. 2D illustrates a FE transistor to describe FIGS. 2A-C.

FIGS. 2A-C illustrate plots 200, 210, and 220 showing the memory principle of a FE transistor, according to some embodiments of the disclosure. The plots are described with reference to n-type transistor M_FEGAIN (of FE Cell 101) of FIG. 2D. It is pointed out that those elements of FIGS. 2A-D having the same reference numbers (or names) as the elements of any other figure can operate or function in any manner similar to that described, but are not limited to such. Here, x-axis is Vgs of FE Cell 101 (i.e., gate to source voltage) and y-axis is the effective threshold voltage (Vt) of M_FEGAIN.

Plot 200 of FIG. 2A shows FE Cell 101 exhibiting hysteresis across Vgs with reference to Vt when Vgs is applied for a duration equal to or more than a minimum transition duration. The gray dotted line that passes between the two thresholds is the behavior of FE Cell 101 over a long period of time (e.g., infinite time response) when the ferroelectric material depolarizes. In some embodiments, when Vgs is applied to transistor M_FEGAIN for more than a minimum transition duration (e.g., 100 nanoseconds (ns)), the ferroelectric material is polarized so that it stores a charge according to the applied Vgs.

The term "minimum transition duration" here generally refers to a suitable duration of time during which a voltage (e.g., Vgs) is applied to a ferroelectric material to cause the ferroelectric material to be polarized and to store a charge according to the applied voltage. The minimum transition duration may be a predetermined value depending on the ferroelectric material stack and their thicknesses. Various embodiments here are described with the minimum transition duration as being 100 ns, however, this parameter should not be understood to be limiting as the minimum transition duration could be designed to be substantially shorter or longer based upon application-specific requirements. In general, longer minimum transition times can enable lower voltage operation, higher read signals, longer ferroelectric retention.

As such, depending on the Vgs, a logic 1 or logic 0 state is stored as charge in the ferroelectric material when Vgs is applied for more or equal to the minimum transition duration. This charge can be substantially non-volatile (i.e., it decays over a very long period of time compared to the required storage/retention time). In some cases, non-volatility can be traded for lower voltage operation. For example, potentially the ferroelectric material could be designed to switch faster at a lower voltage but would also depolarize faster and provide shorter duration of non-volatility (e.g., 1 hour of non-volatile (NV) storage) before a refresh is needed.

The two levels of Vt are High Vt and Low Vt. These two threshold levels indicate the two programmable storage states—logic 1 and logic 0 states. When FE Cell 101 is programmed or the FE material is polarized, a state is stored. For example, logic state 1 is stored when FE Cell 101 is programmed (by application of −Vgs) to high Vt and logic state 0 is stored when FE Cell 101 is programmed (by application of +Vgs) to low Vt.

When a state is stored in transistor M_FEGAIN by a programmed high Vt, a subsequent intermediate Vgs application to transistor M_FEGAIN may cause transistor M_FEGAIN to remain off (because the high Vt is higher than the intermediate Vgs). As such, transistor M_FEGAIN is off and the read current path through the second access transistor MN_RAX (when turned on) is off. When a state is stored by a programmed low Vt, a subsequent intermediate Vgs application to transistor M_FEGAIN will cause transistor M_FEGAIN to turn on (because the low Vt is lower than the normal Vgs). As such, transistor M_FEGAIN is turned on and the read current path through the second access transistor MN_RAX (when turned on) is on. Here, the term "intermediate Vgs" generally refers to a Vgs value less than the Vgs value used to program a logic-1 state but higher than the Vgs value used to program a logic-0 state.

Plot 210 of FIG. 2B shows FE Cell 101 behavior when Vgs is applied to transistor M_FEGAIN for less than the minimum transition duration (e.g., less than 100 ns). In this case, the Vgs may not cause the FE material to be programmed or polarized to store a logic state because the duration of Vgs application is not long enough (i.e., not equal or more than the minimum transition duration). As such, the logic state is stored on the storage node SN by the capacitance on node SN including gate capacitance of transistor M_FEGAIN. The ferroelectric material stacked on the gate terminal of transistor M_FEGAIN provides a large enough gate capacitance for temporarily storing a logic state when the FE material is not programmed or polarized.

When a state is stored on the storage node SN (i.e., by the gate capacitance offered by the ferroelectric material of transistor M_FEGAIN), transistor M_FEGAIN behaves similar to a normal n-type transistor. In this phase of operation, the threshold voltage of M_FEGAIN has a history (i.e., effect the read current is affected more by the applied SN voltage than by this history effect). In this case (i.e., when Vgs is applied for less than a minimum transition duration) the state stored by 3T-FE SRAM bit-cell 100 depends on the state stored on the storage node SN because the ferroelectric material is not polarized.

In some embodiments, transistor M_FEGAIN is off when the voltage or charge on the storage node SN is less than Vt and so the read current path through the second access transistor MN_RAX (when turned on) is off. In some embodiments, transistor M_FEGAIN is on when voltage or charge on the storage node SN is more than the Vt and so the read current path through the second access transistor MN_RAX (when turned on) is on.

Plot 220 of FIG. 2C shows FE Cell 101 behavior after passage of a long duration (i.e., infinite time response). In this case, the ferroelectric material of transistor M_FEGAIN (or FE Cell 101) depolarizes and so the distinction between high Vt and low Vt blurs. For example, plot 220 shows that the Vt becomes in the middle of high Vt and low Vt which makes it difficult to distinguish between the logic 1 or logic 0 states stored in the ferroelectric material. Data in the FE Cell 101 can be lost to depolarization of the FE element which occurs over a long period of time. Additionally, data can be over written by programming FE Cell 101 by the application of a Vgs. Applying a Vgs signal of insufficient magnitude or duration can result in the programming of Vt level intermediate to those defined as Logic-0 or Logic-1.

Figure 3:
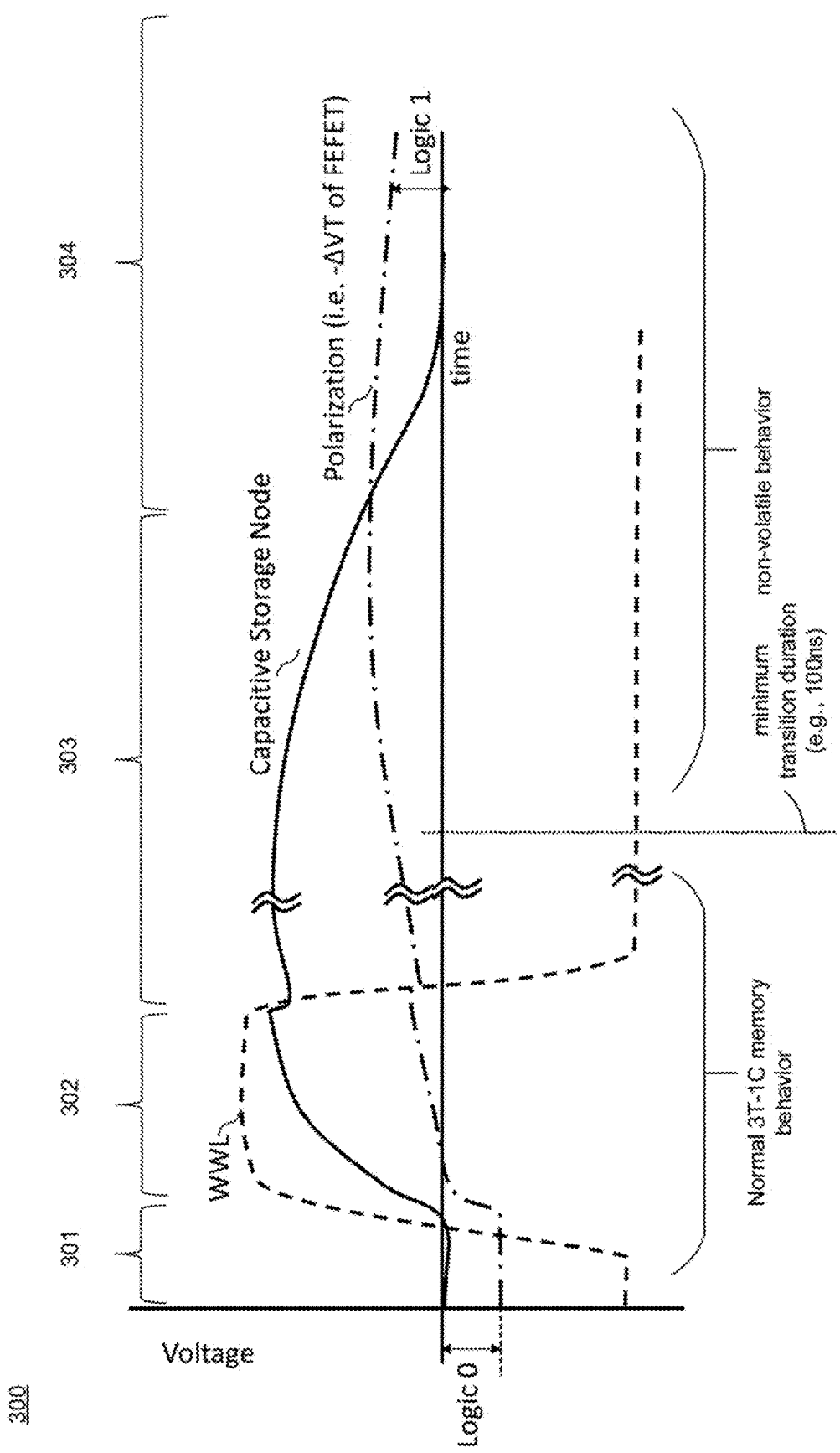
FIG. 3 illustrates a timing diagram of dual mode operations of a 3T-FE SRAM bit-cell, according to some embodiments of the disclosure.

FIG. 3 illustrates timing diagram 300 of dual mode operations of 3T-FE SRAM bit-cell 100, according to some embodiments of the disclosure. It is pointed out that those elements of FIG. 3 having the same reference numbers (or names) as the elements of any other figure can operate or function in any manner similar to that described, but are not limited to such. Here, x-axis is time and y-axis is voltage.

Timing diagram 300 illustrates four timing sections—301, 302, 303, and 304. In this example, 3T-FE SRAM bit-cell 100 initially stores logic 0. During timing section 301, charge on the storage node SN has dissipated but the polarization of the ferroelectric material raises the threshold (Vt) of transistor M_FEGAIN so that the read signal is a logic 0. The read signal could be detected by sensing the current through RBL when RWL turns on transistor MN_RAX.

During timing section 302, WWL is asserted (i.e., it transitions from logic low to logic high to turn on transistor MN_WAX). In this case, the storage node SN is charged through transistor MN_WAX (i.e., the capacitive storage node charges) according to the current flow from WWL to transistor M_FEGAIN. As discussed with reference to FIGS. 2A-D, the ferroelectric material in the gate terminal of transistor M_FEGAIN provides sufficient capacitance for short term state storing on the storage node SN. At the beginning of timing section 303, WWL is de-asserted. When WWL is de-asserted, the write operation completes and the read operation can follow to determine the charge stored on SN. This is the read-after-write operation. During this operation, 3T-FE SRAM bit-cell 100 performance (i.e., write and read operation speeds) is like the performance of a normal 3T-1C memory bit-cell. In this case, memory array operations can continue allowing for high array throughput.

In 10 ns to 100 ns (where 100 ns is the minimum transition duration for this example), the ferroelectric material of transistor M_FEGAIN switches polarization in the background. During the initial 100 ns after the write operation, significant dynamic charge remains on the storage node SN to produce a read signal when RWL turns on transistor MN_RAX. During timing section 304, charge on the storage node can leak away, but charge related to the polarization of the ferroelectric material (i.e., remnant polarization) remains. This remnant polarization helps keep a level of charge in the capacitor that defines the state of the memory. This remnant charge is large enough to produce a read signal (i.e., logic 1). As such, part of timing sections 303 and 304 illustrate the non-volatile behavior of 3T-FE SRAM bit-cell 100.

While the example of FIG. 3 is illustrated with reference to charging the capacitive storage node SN because the initial bit-cell storage state was logic 0, the reverse is also applicable (i.e., when initial bit-cell storage state is logic 1 and the capacitive storage node SN is discharged upon assertion of WWL).

Table 1 shows write and hold operations of 3T-FE SRAM bit-cell 100. Here, 'X' refers to an operation which is not dependent on a value (i.e., a don't care), "+V" and "−V" are positive and negative voltages respectively to overcome hysteresis in the ferroelectric material, "+Δ" and "−Δ" are apparent positive and negative shifts respectively in the threshold (Vt) of transistor M_FEGAIN due to polarization of the gate stack, "V_BL0" refers to the bit-line voltage representing logic '0', "V_BL1" refers to the bit-line voltage representing logic '1', "V_WL0" refers to the word-line voltage needed to turn off the access transistor, and "V_WL1" refers to the word-line voltage need to turn on the access transistor.

TABLE 1

Write/Hold Operations of 3T-FE SRAM bit-cell 100
(Min. Transition Duration 100 ns)

| | WWL | WBL | SN Voltage | ΔVt |
|---|---|---|---|---|
| Write1 | V_WL1 | V_BL1 | Charge to +V | X |
| Background NV Write1 | V_WL0 | X | +V leaks to 0 | Switch to −Δ |
| Write0 | V_WL_1 | V_BL0 | Charge to −V | X |
| Background NV Write0 | V_WL0-Vdd | X | −V leaks to 0 | Switch to +Δ |
| Hold | V_WL0 | X | Hold <100 ns | Hold >100 ns |

To write a logic 1 (i.e., Write1 operation), WWL is asserted to V_WL1 to turn on transistor MN_WAX and WBL is set to V_BL1 to charge the storage node SN to +V. For read-after-write operation, the polarization of transistor M_FEGAIN does not affect logic storage (i.e., change in threshold (ΔV) is a don't care 'X'). A person skilled in the art would appreciate in view of the some embodiments that the initial polarization may affect the exact operation, and that Table 1 is more of a specification for the circuit/device to be designed so the small changes arising from the initial polarization before write may not affect the resulting logic value.

To program a logic 1 in transistor M_FEGAIN (i.e., for background non-volatile (NV) Write1), WWL is de-asserted to V_WL0 to turn off transistor MN_WAX. As such, voltage of WBL does not matter (i.e., it's a don't care 'X'). Overtime, the voltage or charge on the storage node SN discharges to zero (i.e., +V charge on the storage node SN leaks to 0).

To write a logic 0 (i.e., Write0 operation), WWL is asserted to VWL_1 to turn on transistor MN_WAX and WBL is set to V_BL0 to discharge the storage node SN to −V. For read-after-write operation, the polarization of transistor M_FEGAIN does not matter (i.e., change in threshold (ΔV) is a don't care 'X'). To program a logic 0 in transistor M_FEGAIN (i.e., for background non-volatile (NV) Write0), WWL is de-asserted to V_WL0 to turn off transistor MN_WAX. As such, the voltage of WBL does not matter (i.e., it is a don't care 'X'). Overtime, the voltage or charge on the storage node SN discharges to zero (i.e., −V charge on SN leaks to 0).

In some embodiments, the leakage of the storage node SN is constrained such that it is slow enough to allow for ferroelectric switching (e.g., approximately 100 ns in this example). In some embodiments, the capacitance between the gate and source terminals of the write access transistor MN_WAX is small compared to the total capacitance on SN to prevent capacitive disturb. In some embodiments, the ferroelectric polarization caused by V_BL1 is close to the saturation polarization to prevent successive write operations to get too strong a polarity so that it can be erased in a subsequent single write of the opposite polarity. In some embodiments, 3T-FE SRAM bit-cell 100 is designed such that the dominant leakage source(s) pulls charge on the storage node SN to ground so that the gate voltage of the bit-cell has a known reference. In some alternate embodiments, the above constraint can be circumvented by explicitly setting the gate voltage of transistor M_FEGAIN via the write access transistor MN_WAX before a read operation.

The last row in Table 1 illustrates the hold operation. This is the case where transistor MN_WAX is turned off by setting WBL to V_WL0. For cases where the read operation follows the write operation within the minimum transition duration (e.g., 100 ns), the charge stored on the storage node SN is the state held by 3T-FE SRAM bit-cell 100. After passage of minimum transition duration (i.e., 100 ns or more), the charge on the storage node SN causes the ferroelectric material to polarize and a state is stored (by setting a threshold voltage Vt of transistor M_FEGAIN). This state is the non-volatile state. As such, 3T-FE SRAM bit-cell 100 exhibits both 3T-1C bit-cell like performance with little or no refresh operation (i.e., like an SRAM bit-cell) and with capability of non-volatility.

Table 2 shows the read operation of 3T-FE SRAM bit-cell 100.

TABLE 2

Read Operation of 3T-FE SRAM bit-cell 100
(Min. Transition Duration 100 ns)

| | RWL | SN Voltage | ΔVt | RBL Current |
|---|---|---|---|---|
| Read1 (t < 100 ns) | V_WRL1 | +V | X | High |
| Read1 (t > 100 ns) | V_WRL1 | 0 | −Δ | High |
| Read0 (t < 100 ns) | V_WRL1 | −V | X | Low |
| Read0 (t > 100 ns) | V_WRL1 | 0 | +Δ | Low |

To read data stored in 3T-FE SRAM bit-cell 100, RWL is set to V_RWL1 to turn on transistor MN_RAX, and then current on RBL is sensed. If the current is high, then the data read is logic 1, and if the sensed current is comparatively low, then the data read is logic 0. Depending on how soon the read operation follows the write operation (relative to the minimum transition duration), logic is either determined from the charge stored on the storage node SN or from the polarized ferroelectric material. If the read operation is performed within the minimum transition duration (e.g., 100 ns), then the voltage on the storage node SN determines the on/off state of transistor M_FEGAIN.

For example, in some embodiments, when the voltage on the storage node SN is +V and read operation is performed within the minimum transition duration, then the transistor M_FEGAIN turns on and the current sensed on RBL (i.e., current is high). In this case, logic 1 is determined from 3T-FE SRAM bit-cell 100 and the polarization of the ferroelectric material transistor M_FEGAIN does not matter. In some embodiments, when the voltage on the storage node SN is −V and read operation is performed within the minimum transition duration, then the transistor M_FEGAIN turns off and very little current if any (i.e., current is low) is sensed on RBL. In this case, logic 0 is determined from 3T-FE SRAM bit-cell 100.

In some embodiments, when the charge on the storage node SN is discharged to ground (e.g., by leakage), current is sensed on RBL (i.e., current is high). The charge on the storage node SN discharges to ground because read operation is performed after the minimum transition duration (i.e., 100 ns or more) and the ferroelectric material of transistor M_FEGAIN is programmed to low threshold (because the charge on the storage node SN remained on the storage node SN long enough to polarize the ferroelectric material), which causes transistor M_FEGAIN to turn on. In this case, logic 1 is determined from 3T-FE SRAM bit-cell 100.

In some embodiments, when the charge on the storage node SN is discharged to ground because read operation is performed after the minimum transition duration (i.e., 100 ns or more) and the ferroelectric material of transistor M_FEGAIN is programmed to high threshold, the transistor M_FEGAIN is off and little current if any is sensed on RBL (i.e., current is low). In this case, logic 0 is determined from 3T-FE SRAM bit-cell 100.

In some embodiments, the read current is proportional to the built-in polarization of the ferroelectric element (i.e., the ferroelectric material integrated with the gate terminal of transistor M_FEGAIN) and the storage node SN voltage from charging or discharging the capacitance on the storage node SN. In some embodiments, 3T-FE SRAM bit-cell 100 inherently uses both effects for operation when each effect is the strongest. For example, the voltage or charge on the storage node SN dominates the effect of read current immediately after write operation while the built-in polarization of the ferroelectric element dominates the effect of read current when read operation is performed after the minimum transition duration (i.e., the polarization of the ferroelectric material holds the logic state in the long term).

In some embodiments, for read-after-write operations, the storage node SN is written to a high enough voltage magnitude to overcome the effects of the threshold shift in the ferroelectric element (that occurs at longer time scale). Table 3 below summarizes, for brevity sake, the dual mode read operation of 3T-FE SRAM bit-cell 100. Here, dual mode generally refers to the capability of 3T-FE SRAM bit-cell 100 to read data stored on the storage node SN (for back to back read-after-write operations) and in the ferroelectric element during non-volatile storage mode.

TABLE 3

Dual Mode Read Operation of 3T-FE SRAM bit-cell 100

| SN Voltage | ΔVt | Read signal | Notes |
|---|---|---|---|
| 0 | +Δ | 1 | FE material is polarized but non-builtin charge |
| 0 | −Δ | 0 | on SN has leaked away. Here, non-volatile FE state dominates the read |
| −V | +Δ | 1 | FE polarization has switched and non-builtin |
| +V | −Δ | 0 | charge on SN has not leaked away |
| −V | −Δ | 1 | SN is fully charged, but FE has yet to fully |
| +V | +Δ | 0 | switch. SN voltage dominates the read |

Figure 4:
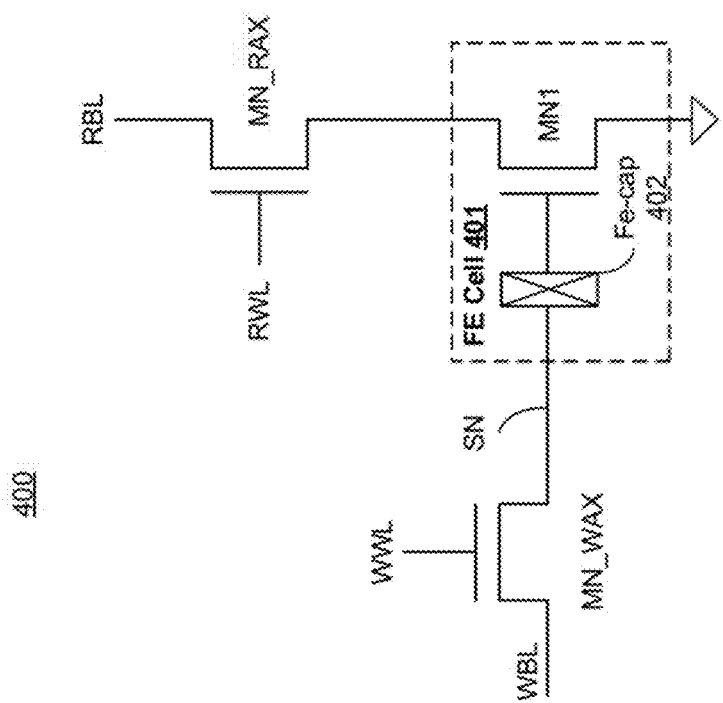
FIG. 4 illustrates an n-type 3T-FE SRAM bit-cell, according to some embodiments of the disclosure.

FIG. 4 illustrates a 3T-FE SRAM bit-cell 400, according to some embodiments of the disclosure. It is pointed out that those elements of FIG. 4 having the same reference numbers (or names) as the elements of any other figure can operate or function in any manner similar to that described, but are not limited to such. So as not to obscure the embodiments, differences between 3T-FE SRAM bit-cell 100 and 3T-FE SRAM bit-cell 400 are discussed.

In some embodiments, the ferroelectric cell does not have the ferroelectric element or material (also referred to as the ferroelectric cap (Fe-cap)) fully integrated within the gate terminal of the transistor in the ferroelectric cell, such as transistor M_FEGAIN. For example, the Fe-cap is coupled to the gate terminal of transistor in the ferroelectric cell. In some embodiments, FE Cell 401 comprises Fe-cap 402 coupled in series with the storage node SN and the gate terminal of n-type transistor MN1. Operation wise, FE Cell 401 behaves the same as FE Cell 101, but in this case a traditional transistor is used in FE Cell 401 instead of a new device having the ferroelectric material fully integrated within the gate stack of the transistor (such as transistor M_FEGAIN).

Figure 5:
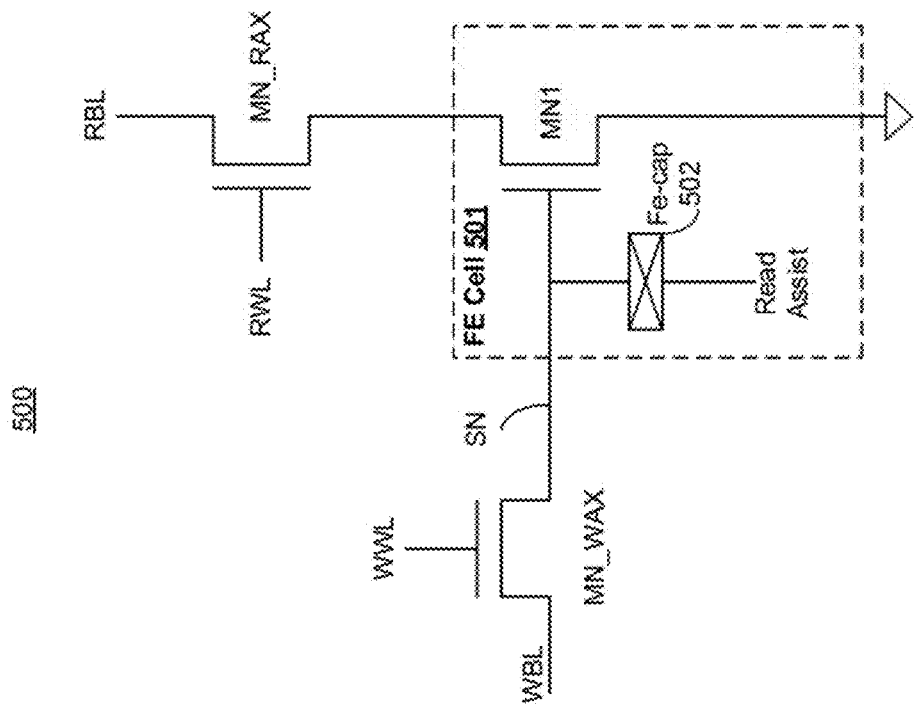
FIG. 5 illustrates an n-type 3T-FE SRAM bit-cell, according to some embodiments of the disclosure.

FIG. 5 illustrates 3T-FE SRAM bit-cell 500, according to some embodiments of the disclosure. It is pointed out that those elements of FIG. 5 having the same reference numbers (or names) as the elements of any other figure can operate or function in any manner similar to that described, but are not limited to such. So as not to obscure the embodiments, differences between 3T-FE SRAM bit-cell 100 and 3T-FE SRAM bit-cell 500 are discussed.

In some embodiments, the ferroelectric cell does not have the Fe-cap fully integrated within the gate terminal of the transistor in the ferroelectric cell, such as transistor M_FEGAIN. For example, the Fe-cap is coupled to the gate terminal of transistor in the ferroelectric cell. In some embodiments, FE Cell 501 comprises Fe-cap 502 coupled to the storage node SN and the gate terminal of n-type transistor MN1. In some embodiments, one terminal of Fe-cap 502 is coupled to the storage node SN and the other terminal of Fe-cap 502 is coupled to a Read Assist node that receives a Read Assist signal.

Here, the Read Assist node is capacitively coupled to SN through the ferroelectric capacitor 502. In some embodiments, the strength of the coupling is dependent on the polarization of the FE-cap 502. In some embodiments, during a read operation, the Read Assist node can be asserted (i.e. raised to a higher voltage) and cause the coupled SN node to rise as well. The resulting voltage on SN is dependent on the polarization of the Fe-cap 502. Operation wise, FE Cell 501 behaves the same as FE Cell 101, but in this case a traditional transistor is used in FE Cell 501 instead of a new device having the ferroelectric material fully integrated within the gate stack of the transistor (such as transistor M_FEGAIN).

Figure 6:
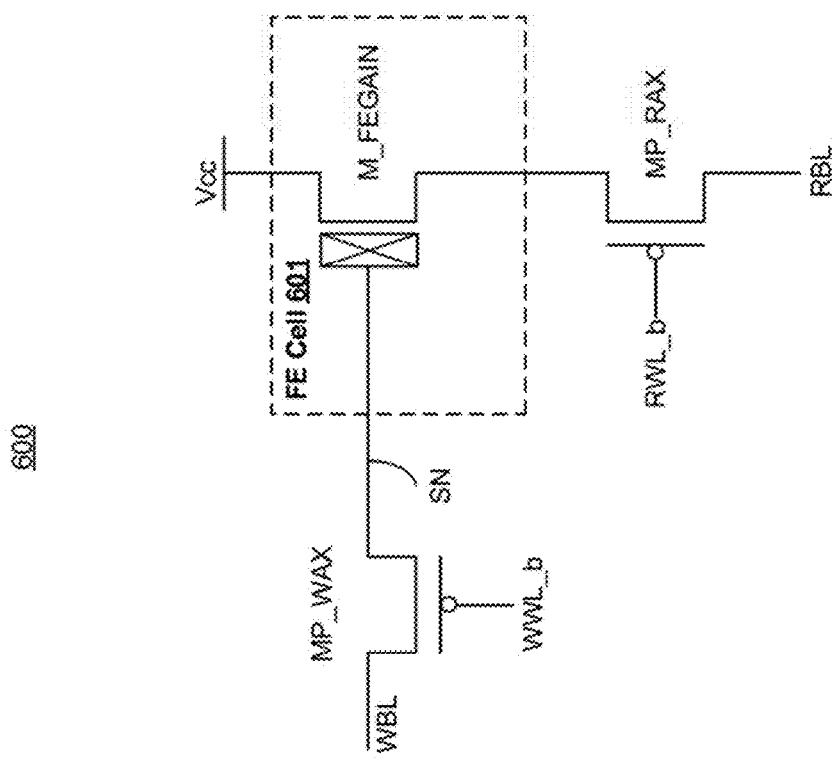
FIG. 6 illustrates a p-type 3T-FE SRAM bit-cell, according to some embodiments of the disclosure.

FIG. 6 illustrates p-type 3T-FE SRAM bit-cell 600, according to some embodiments of the disclosure. It is pointed out that those elements of FIG. 6 having the same reference numbers (or names) as the elements of any other figure can operate or function in any manner similar to that described, but are not limited to such. So as not to obscure the embodiments, differences between 3T-FE SRAM bit-cell 100 and 3T-FE SRAM bit-cell 600 are discussed.

In some embodiments, n-type transistors of 3T-FE SRAM bit-cell 100 are replaced with p-type transistors and polarity of control signals is inverted. For example, the n-type transistor MN_WAX is replaced with p-type transistor MP_WAX, where the gate terminal of MP_WAX is controllable by an inverse of WWL (i.e., WWL_b). In some embodiments, the n-type transistor MN_RAX is replaced with a p-type transistor MP_RAX, where the gate terminal of MP_RAX is controlled by an inverse of RWL (i.e., RWL_b). In some embodiments, 3T-FE SRAM bit-cell 600 uses an n-type read access transistor MN_RAX controllable by RWL just like transistor MN_RAX of 3T-FE SRAM bit-cell 100.

In some embodiments, FE Cell 601 includes a transistor M_FEGAIN with fully integrated ferroelectric material in its gate terminal, where M_FEGAIN is a p-type transistor. Structurally, 3T-FE SRAM bit-cell 600 is complementary to 3T-FE SRAM bit-cell 100. Operation wise, 3T-FE SRAM bit-cell 600 behaves similar to 3T-FE SRAM bit-cell 100 but with complementary control signals.

Figure 7:
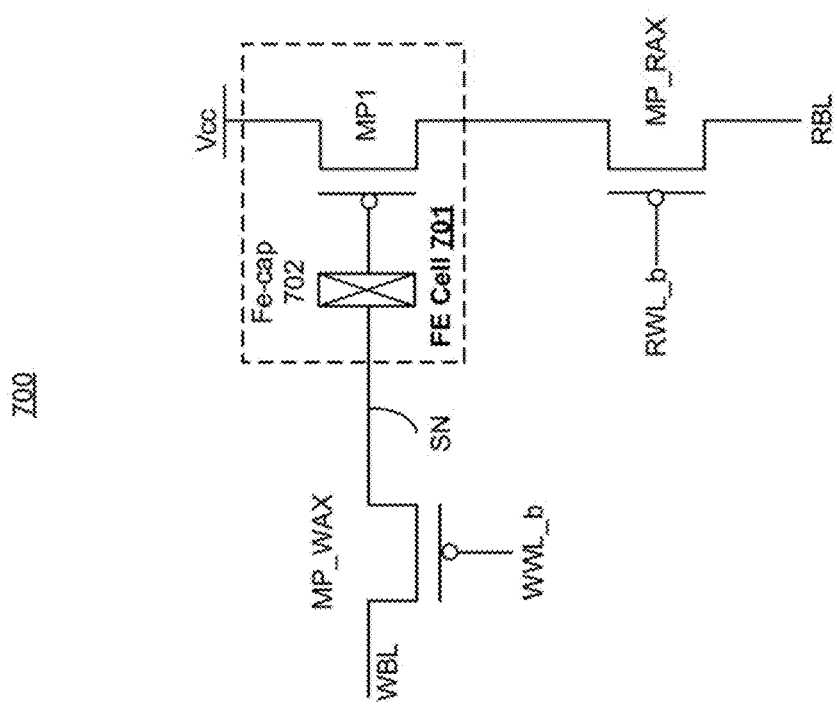
FIG. 7 illustrates a p-type 3T-FE SRAM bit-cell, according to some embodiments of the disclosure.

FIG. 7 illustrates p-type 3T-FE SRAM bit-cell 700, according to some embodiments of the disclosure. It is pointed out that those elements of FIG. 7 having the same reference numbers (or names) as the elements of any other figure can operate or function in any manner similar to that described, but are not limited to such. So as not to obscure the embodiments, differences between 3T-FE SRAM bit-cell 600 and 3T-FE SRAM bit-cell 700 are discussed.

In some embodiments, the ferroelectric cell does not have the Fe-cap fully integrated within the gate terminal of the transistor in the ferroelectric cell, such as transistor M_FEGAIN. For example, the Fe-cap is coupled to the gate terminal of transistor in the ferroelectric cell. In some embodiments, FE Cell 701 comprises Fe-cap 702 coupled in series with the storage node SN and the gate terminal of a p-type transistor MP1. Operation wise, FE Cell 701 behaves the same as FE Cell 601, but in this case a traditional transistor is used in FE Cell 701 instead of a new device having the ferroelectric material fully integrated within the gate stack of the transistor (such as transistor M_FEGAIN of FE Cell 601).

Figure 8:
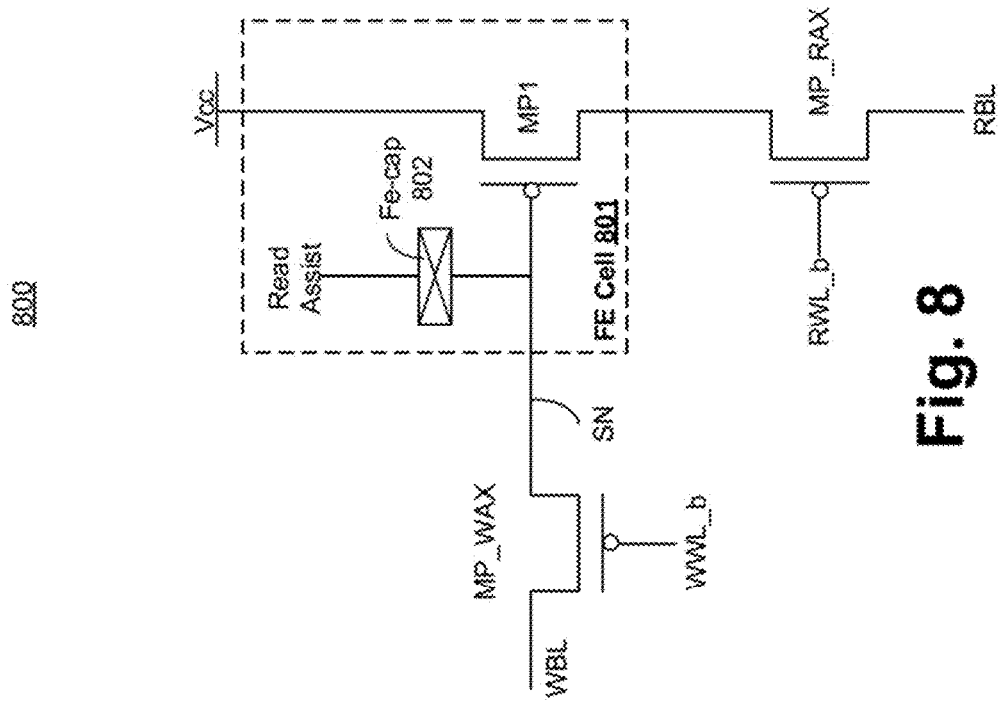
FIG. 8 illustrates a p-type 3T-FE SRAM bit-cell, according to some embodiments of the disclosure.

FIG. 8 illustrates p-type 3T-FE SRAM bit-cell 800, according to some embodiments of the disclosure. It is pointed out that those elements of FIG. 8 having the same reference numbers (or names) as the elements of any other figure can operate or function in any manner similar to that described, but are not limited to such. So as not to obscure the embodiments, differences between 3T-FE SRAM bit-cell 600 and 3T-FE SRAM bit-cell 800 are discussed.

In some embodiments, the ferroelectric cell does not have the Fe-cap fully integrated within the gate terminal of the transistor in the ferroelectric cell, such as transistor M_FEGAIN of Fe Cell 601. For example, the Fe-cap is coupled to the gate terminal of transistor in the ferroelectric cell. In some embodiments, FE Cell 801 comprises Fe-cap 802 coupled to the storage node SN and the gate terminal of p-type transistor MP1. In some embodiments, one terminal of Fe-cap 802 is coupled to the storage node SN and the other terminal of Fe-cap 802 is coupled to a Read Assist node that receives a Read Assist signal. Here, the Read Assist node is capacitively coupled to SN through the ferroelectric capacitor 802. In some embodiments, the strength of the coupling is dependent on the polarization of the FE-cap 802.

In some embodiments, during a read operation, the Read Assist node can be asserted (i.e. raised to a lower voltage for p-type) and cause the coupled SN node to fall as well. The resulting voltage on SN is dependent on the polarization of the Fe-cap 802. Operation wise, FE Cell 801 behaves the same as FE Cell 601, but in this case a traditional transistor is used in FE Cell 801 instead of a new device having the ferroelectric material fully integrated within the gate stack of the transistor (such as transistor M_FEGAIN of Fe Cell 601).

Figure 9:
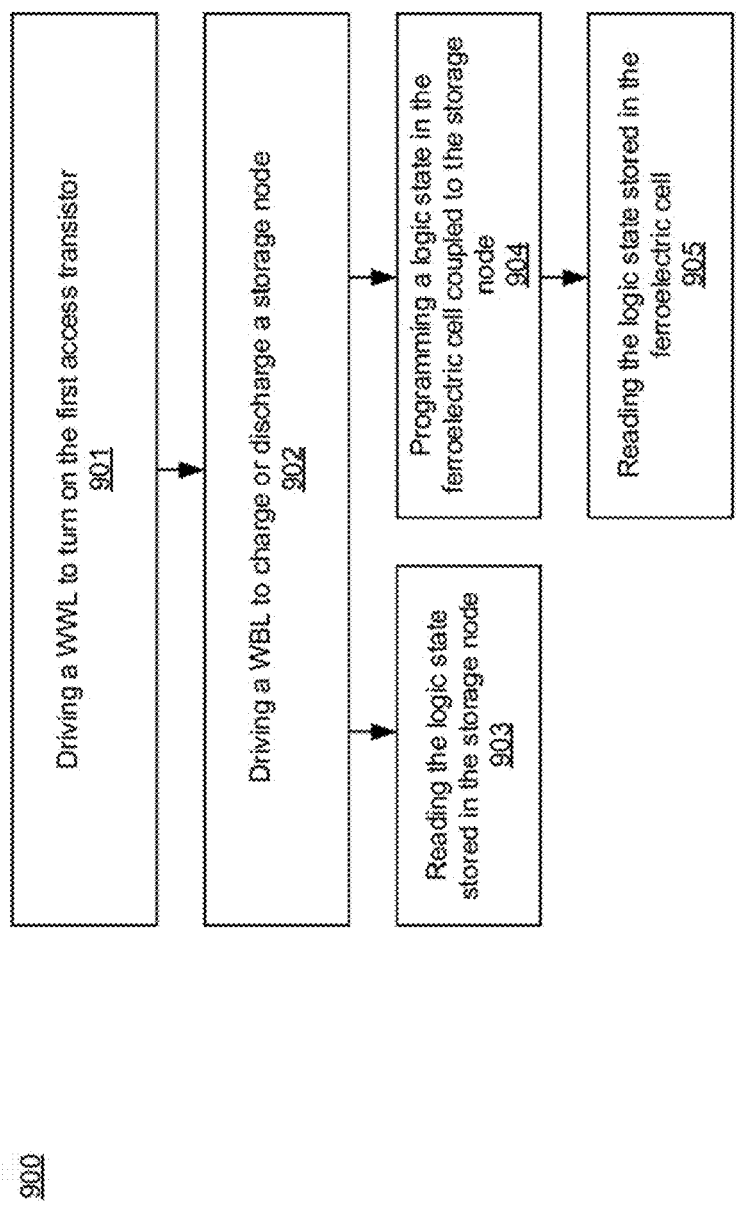
FIG. 9 illustrates a flowchart of a method for operating a 3T-FE SRAM bit-cell, according to some embodiments of the disclosure.

FIG. 9 illustrates flowchart 900 of a method for operating 3T-FE SRAM bit-cell 100, according to some embodiments of the disclosure. It is pointed out that those elements of FIG. 9 having the same reference numbers (or names) as the elements of any other figure can operate or function in any manner similar to that described, but are not limited to such.

Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 901, WWL is driven by a word-line driver (not shown) to cause the first access transistor MN_WAX to turn on. As such, 3T-FE SRAM bit-cell 100 is enabled for write operation. At block 902, WBL is driven to charge or discharge a capacitive storage node SN, coupled to the first access transistor MN_WAX and FE Cell 101, when the first access transistor MN_WAX is turned on. FE Cell 101 is coupled to the storage node SN and programmable according to the charged or discharged storage node SN.

At block 903, logic state stored on the storage node SN is read by the second access transistor MN_RAX. In some embodiments, to read the stored state before it dissipates, WWL is driven to cause the first access transistor MN_WAX to turn off. RWL is then driven to cause the second access transistor MN_RAX to turn on. Current through the RBL is then sensed to determine the state stored in the storage node SN. As discussed with reference to Table 2, if the sensed current on RBL is high (e.g., above a high threshold limit) then the logic state read is logic 1 and when the sensed current on RBL is comparatively low (e.g., below a low threshold limit), the logic state read is logic 0.

At block 904, a logic state is programmed in FE Cell 101 according to the charged or discharged storage node. In some embodiments, the WBL and WWL are powered long enough (i.e., more than the minimum transition duration) to capacitively charge the storage node SN which takes much less time than the time to flip the ferroelectric state of FE Cell 101. In some embodiments, after charging the capacitive storage node SN, the WWL and WBL can be turned off. With the WWL and WBL turned off, the capacitive storage node SN leakage is designed to be suitable enough (e.g., low enough) to allow FE Cell 101 to switch (or polarize) before the logic state is lost due to leakage.

At block 905, the logic state stored in ferroelectric cell FE Cell 101 is read. In some embodiments, to read the logic state, WWL is de-asserted to cause the first transistor MN_WAX to turn off. The RWL is then driven to cause the second access transistor MN_RAX to turn on. Current through the RBL is then sensed to determine the state stored in the storage node SN. As discussed with reference to Table 2, if the sensed current on RBL is higher than a first current threshold limit (after passage of the minimum transition duration) then the logic state read is logic 1 and when the sensed current on RBL is lower than a second current threshold limit (after passage of the minimum transition duration) then the logic state read is logic 0.

In some embodiments, the read current is proportional to the built-in polarization of the ferroelectric element (i.e., the ferroelectric material integrated with the gate terminal of transistor M_FEGAIN) and the voltage on the storage node SN from charging or discharging the capacitance of the storage node SN. In some embodiments, 3T-FE SRAM bit-cell 100 inherently uses both effects for operation when each effect is the strongest. For example, the voltage or charge on the storage node SN dominates the effect of read current immediately after write operation while the built-in polarization of the ferroelectric element dominates the effect of read current when read operation is performed after the minimum transition duration (i.e., the polarization of the ferroelectric material holds the logic state in the long term).

In some embodiments, the layout of 3T-FE SRAM bit-cell 100 is comparable in size to the layout of 3T-eDRAM cell (i.e., the layout of 3T-FE SRAM bit-cell 100 is smaller than the layout of a traditional 6T SRAM bit-cell but larger than the layout of a 1T-1C eDRAM bit-cell). Some embodiments do not require an express bit-cell capacitor because the ferroelectric element itself provides the capacitance for storing data. For example, when the ferroelectric element is integrated within the gate terminal of M_FEGAIN, the gate capacitance increases enough to provide storage capacitance on the storage node SN. Some embodiments, as described with reference to FIGS. 4-5 and FIGS. 7-8, do not use a ferroelectric FET. In those embodiments, ferroelectric element is separate from the FET (e.g., transistor MN1 or MP1).

Figure 10:
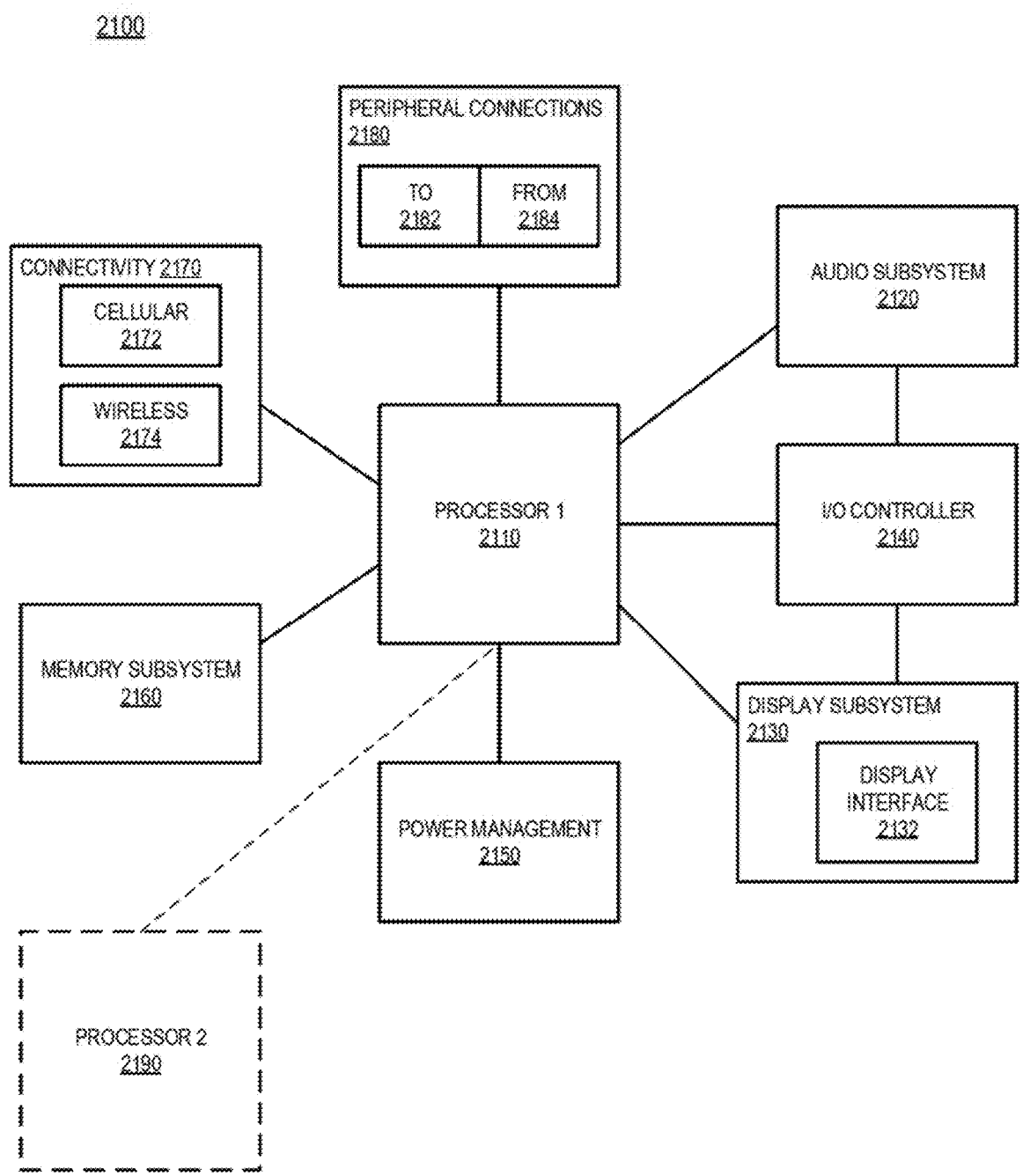
FIG. 10 illustrates a smart device or a computer system or a SoC (System-on-Chip) having memory with 3T-FE SRAM bit-cells, according to some embodiments.

FIG. 10 illustrates a smart device or a computer system or a SoC (System-on-Chip) 2100 having memory with 3T-FE SRAM bit-cells, according to some embodiments. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with memory having 3T-FE SRAM bit-cells, according to some embodiments discussed. Other blocks of the computing device 2100 may also include the memory having 3T-FE SRAM bit-cells of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first access transistor controllable by a write word-line (WWL); a second access transistor controllable by a read word-line (RWL); and a ferroelectric cell coupled to the first and second access transistors, wherein the ferroelectric cell is programmable via the WWL and readable via the RWL.

In some embodiments, the ferroelectric cell includes a transistor having a gate terminal coupled to a ferroelectric capacitor. In some embodiments, the ferroelectric capacitor is programmable via the WWL. In some embodiments, the ferroelectric capacitor is integrated within the gate terminal of the transistor of the ferroelectric cell.

In some embodiments, the ferroelectric capacitor is coupled in series between the gate terminal of the transistor of the ferroelectric cell and the first access transistor. In some embodiments, the ferroelectric capacitor is coupled to the gate terminal of the transistor of the ferroelectric cell, the first access transistor, and a node for providing a read-assist signal. In some embodiments, the first access transistor, the second access transistor, and the ferroelectric cell are formed of ferroelectric material. In some embodiments, the first access transistor includes: a source/drain terminal coupled to a write bit-line (WBL), and a drain/source terminal coupled to the ferroelectric cell. In some embodiments, the second access transistor includes: a source/drain terminal coupled to a read bit-line (RBL), and a drain/source terminal coupled to the ferroelectric cell.

In another example, a system is provided which comprises: a processor; a memory coupled to the processor, the memory including an apparatus according to the apparatus described above; and a wireless interface for allowing the processor to communicate with another device.

In another example, a method is provided which comprises: driving a write word-line (WWL), coupled to a gate terminal of a first access transistor, to cause the first access transistor to turn on; and driving a write bit-line (WBL) coupled to a source/drain terminal of the first access transistor, the driven WBL to charge or discharge a storage node coupled to the first access transistor when the first access transistor is turned on, wherein the ferroelectric cell is coupled to the storage node and programmable according to the charged or discharged storage node.

In some embodiments, the method comprises programming a logic state in the ferroelectric cell according to the charged or discharged storage node. In some embodiments, programming the logic state in the ferroelectric cell comprises: driving the WBL and WWL for a suitable duration to charge or discharge the storage node; turning off the first access transistor; and switching a ferroelectric material of the ferroelectric cell according to the charged or discharged storage node.

In some embodiments, the method comprises driving a read word-line (RWL), coupled to a gate terminal of a second access transistor, to cause a second access transistor to turn off when the first access transistor is turned on, wherein the second access transistor is coupled to the ferroelectric cell. In some embodiments, the method comprises: driving the WWL to cause the first access transistor to turn off; driving the RWL to cause the second access transistor to turn on; and sensing a read bit-line (RBL), coupled to the second access transistor, to determine a logic state programmed in the ferroelectric cell.

In some embodiments, the method comprises: driving the WWL to cause the first access transistor to turn off; driving the RWL to cause the second access transistor to turn on; and sensing a read bit-line (RBL), coupled to the second access transistor, to determine a logic state stored in the storage node.

In another example, an apparatus is provided which comprises: means for driving a write word-line (WWL), coupled to a gate terminal of a first access transistor, to cause the first access transistor to turn on; and means for driving a write bit-line (WBL) coupled to a source/drain terminal of the first access transistor, the driven WBL to charge or discharge a storage node coupled to the first access transistor when the first access transistor is turned on, wherein the ferroelectric cell is coupled to the storage node and programmable according to the charged or discharged storage node.

In some embodiments, the apparatus comprises means for programming a logic state in the ferroelectric cell according to the charged or discharged storage node. In some embodiments, the means for programming the logic state in the ferroelectric cell comprises: means for driving the WBL and WWL for a suitable duration to charge or discharge the storage node; means for turning off the first access transistor; and means for switching a ferroelectric material of the ferroelectric cell according to the charged or discharged storage node.

In some embodiments, the apparatus comprises means for driving a read word-line (RWL), coupled to a gate terminal of a second access transistor, to cause a second access transistor to turn off when the first access transistor is turned on, wherein the second access transistor is coupled to the ferroelectric cell. In some embodiments, the apparatus comprises: means for driving the WWL to cause the first access transistor to turn off; means for driving the RWL to cause the second access transistor to turn on; and means for sensing a read bit-line (RBL), coupled to the second access transistor, to determine a logic state programmed in the ferroelectric cell.

In some embodiments, the apparatus comprises: means for driving the WWL to cause the first access transistor to turn off; means for driving the RWL to cause the second access transistor to turn on; and means for sensing a read bit-line (RBL), coupled to the second access transistor, to determine a logic state stored in the storage node.

In another example, a system is provided which comprises: a processor; a memory coupled to the processor, the memory including an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first access device controllable by a write word-line (WWL);
   a second access device controllable by a read word-line (RWL); and
   a cell comprising ferroelectric material, wherein the cell is coupled to the first and second access devices, and wherein the cell is programmable via the WWL and readable via the RWL,
   wherein the cell includes a device having a gate terminal, which includes a capacitor comprising ferroelectric material, wherein the device has a source and a drain terminal, and wherein if the device is an n-type device then one of the source or drain terminal is connected to a ground node, otherwise if the device is a p-type device then the source or drain terminal is connected to a power supply node.

2. The apparatus of claim 1, wherein the capacitor is programmable via the WWL.

3. The apparatus of claim 1, wherein the capacitor is integrated within the gate terminal of the device of the cell.

4. The apparatus of claim 1, wherein the capacitor is coupled in series with the first access device.

5. The apparatus of claim 1, wherein the capacitor is coupled to the first access device and a node to provide a read-assist signal.

6. The apparatus of claim 1, wherein the first access device, the second access device, and the cell comprise the ferroelectric material.

7. The apparatus of claim 1, wherein the first access device includes:
one of a source or drain terminal coupled to a write bit-line (WBL); and
one of a source or drain terminal coupled to the cell.

8. The apparatus of claim 1, wherein the second access device includes:
one of a source or drain terminal coupled to a read bit-line (RBL); and
one of a source or drain terminal coupled to the cell.

9. A method comprising:
driving a write word-line (WWL), coupled to a gate terminal of a first access transistor, to cause the first access transistor to turn on;
driving a write bit-line (WBL), coupled to one of a source or drain terminal of the first access transistor, the driven WBL to charge or discharge a storage node coupled to the first access transistor when the first access transistor is turned on; and
programming a logic state in a ferroelectric cell according to the charged or discharged storage node,
wherein the ferroelectric cell includes a device having a gate terminal which includes a capacitor comprising ferroelectric material, wherein the device has a source and a drain terminal, and wherein if the device is an n-type device then one of the source or drain terminal is connected to a ground node, otherwise if the device is a p-type device then the source or drain terminal is connected to a supply node.

10. The method of claim 9, wherein the ferroelectric cell is coupled to the storage node.

11. The method of claim 9, wherein programming the logic state in the ferroelectric cell comprises:
driving the WBL and WWL for a suitable duration to charge or discharge the storage node;
turning off the first access transistor; and
switching a ferroelectric material of the ferroelectric cell according to the charged or discharged storage node.

12. The method of claim 9 comprises driving a read word-line (RWL), coupled to a gate terminal of a second access transistor, to cause a second access transistor to turn off when the first access transistor is turned on, wherein the second access transistor is coupled to the ferroelectric cell.

13. The method of claim 12 comprises:
driving the WWL to cause the first access transistor to turn off;
driving the RWL to cause the second access transistor to turn on; and
sensing a read bit-line (RBL), coupled to the second access transistor, to determine a logic state programmed in the ferroelectric cell.

14. The method of claim 12 comprises:
driving the WWL to cause the first access transistor to turn off;
driving the RWL to cause the second access transistor to turn on; and
sensing a read bit-line (RBL), coupled to the second access transistor, to determine a logic state stored in the storage node.

15. A system comprising:
a processor;
a memory coupled to the processor, the memory including:
a first access device controllable by a write word-line (WWL);
a second access device controllable by a read word-line (RWL); and
a cell coupled to the first and second access devices, wherein the cell comprises a ferroelectric material, wherein the cell is programmable via the WWL and readable from via the RWL, wherein the cell includes a device having a gate terminal which includes a capacitor comprising ferroelectric material, wherein the device has a source and a drain terminal, and wherein if the device is an n-type device then one of the source or drain terminal is connected to a ground node when the device is an n-type device, otherwise if the device is a p-type device then one of the source or drain terminal is connected to a supply node when the device is a p-type device; and
a wireless interface to allow the processor to communicate with another device.

16. The system of claim 15, wherein the device includes a transistor.

17. The system of claim 15, wherein the capacitor is programmable via the WWL.

18. The system of claim 15, wherein the capacitor is integrated within the gate terminal of the transistor of the cell.

19. The system of claim 15, wherein the capacitor is coupled in series with the first access transistor.

20. An apparatus comprising:
a first access device controllable by a write word-line (WWL);
a second access device controllable by a read word-line (RWL); and
a cell comprising ferroelectric material, wherein the cell is coupled to the first and second access devices, and wherein the cell is programmable via the WWL and readable via the RWL,
wherein the cell includes:
a gate including a capacitor comprising ferroelectric material, wherein the capacitor is coupled to a read assist line;
an n-type device having a gate terminal coupled to the gate, wherein the device has a source and a drain terminal, wherein the source terminal is connected to a ground node, and wherein the drain terminal is connected to the second access device.

21. The apparatus of claim 20, wherein the first and second access devices are n-type devices.

* * * * *